United States Patent [19]

Stoll

[11] Patent Number: 5,717,508
[45] Date of Patent: Feb. 10, 1998

[54] METHOD FOR DYNAMICALLY REFRESHING ANGLE-MULTIPLEXED HOLOGRAMS IN PHOTOREFRACTIVE MEDIA

[75] Inventor: Harold M. Stoll, Rancho Palos Verdes, Calif.

[73] Assignee: Northrop Grumman Corporation, Los Angeles, Calif.

[21] Appl. No.: 422,279

[22] Filed: Apr. 13, 1995

[51] Int. Cl.$^6$ .................................................. G03H 1/02
[52] U.S. Cl. .............................. 359/3; 359/7; 359/22; 365/125; 369/103
[58] Field of Search .......................... 359/3, 7, 10, 22, 359/24; 365/125, 216; 369/103

[56] References Cited

U.S. PATENT DOCUMENTS

| | | | |
|---|---|---|---|
| 3,935,566 | 1/1976 | Snopko | 365/123 |
| 5,128,693 | 7/1992 | Tatemichi et al. | 347/260 |
| 5,339,305 | 8/1994 | Curtis et al. | 369/112 |
| 5,440,669 | 8/1995 | Rakuljic et al. | 359/7 |

OTHER PUBLICATIONS

"Multiple Storage and Erasure of Fixed Holograms in Fe-Doped LiNbO$_3$", *Applied Physics Letters*, vol. 26, No. 4, p. 182 (1975).

"Storage of 500 High-Resolution Holograms in a LiNbO$_3$ Crystal", *Optics Letters*, vol. 16, No. 8, p. 605 (1991).

"Theory of Optical Information Storage In Solids", *Applied Optics*, vol. 2, No. 4, p. 393 (1963).

"Self Enhancement in Lithium Niobate", *Optics Communications*, vol. 72, No. 3, 4, p. 175 (1989).

"Single-Step Copying Process for Multiplexed Volume Holograms", *Optics Letters*, vol. 17, No. 9, p. 676 (1992).

*Primary Examiner*—Paul M. Dzierzynski
*Assistant Examiner*—Darren E. Schuberg
*Attorney, Agent, or Firm*—Terry J. Anderson; Karl J. Hoch, Jr.

[57] ABSTRACT

A method and system are disclosed for dynamically refreshing angle-multiplexed holograms stored in a photorefractive medium. In accordance with the invention the photorefractive medium is simultaneously exposed to a plurality of reference beams. Each reference beam is oriented at an angle corresponding to an angle at which a hologram was previously stored within the photorefractive medium. The frequency and duration of the reference beams are regulated such that each reference beam enhances the diffraction efficiency of an associated hologram, stored at the angle corresponding to the angle of the reference beam. Each reference beam is preferably at a frequency different from the frequency of the other reference beams so as to avoid the generation of plane-wave holograms due to interference between the multiple reference beams.

12 Claims, 4 Drawing Sheets

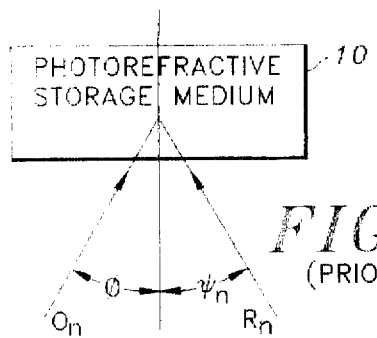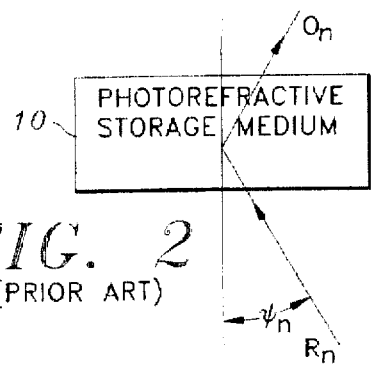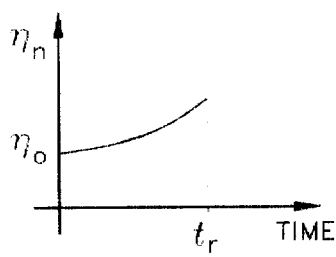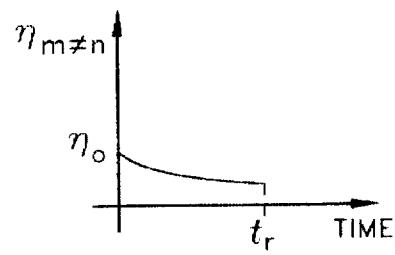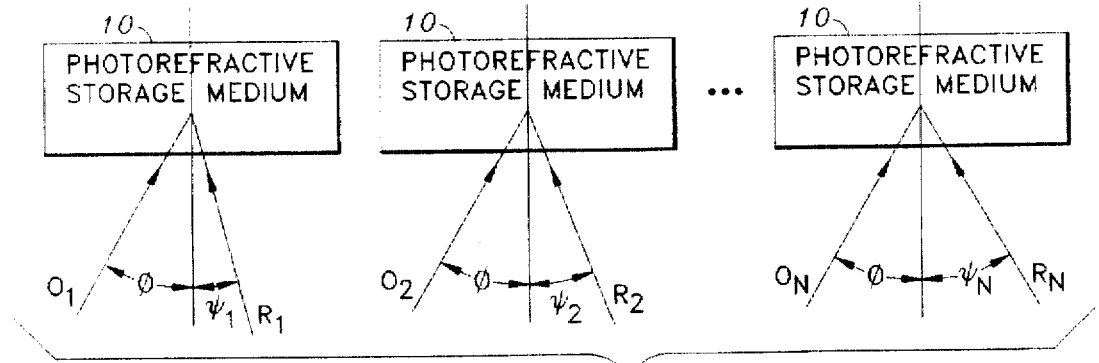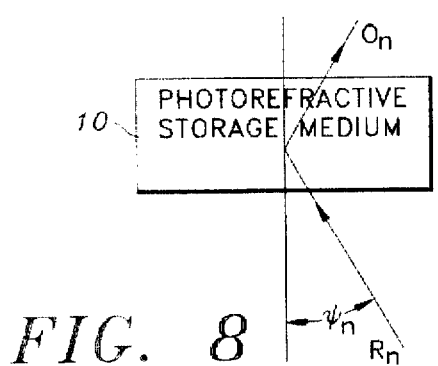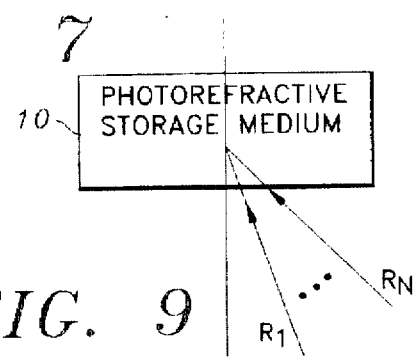

METHOD FOR DYNAMICALLY REFRESHING ANGLE-MULTIPLEXED HOLOGRAMS IN PHOTOREFRACTIVE MEDIA

FIELD OF THE INVENTION

The present invention relates generally to holographic storage devices and more particularly to a method for dynamically refreshing angle-multiplexed holograms in photorefractive media wherein the photorefractive media is simultaneously exposed to a plurality of reference beams differing in frequency so as to enhance the holograms stored therein without generating undesirable plane-wave holograms within the media.

BACKGROUND OF THE INVENTION

Holographic techniques for storing images are well known. Such techniques are commonly used to store images in a wide variety of different applications. Additionally, various methodologies for utilizing such holographic techniques to store digital data for use in computer systems are currently being explored.

The technique for forming holograms comprises splitting the highly coherent output beam of a laser into separate reference and object beams. The reference beam is directed onto the holographic storage medium, e.g., a photorefractive material, while the object beam is directed onto the object whose image is to be stored. Light from the object is directed to the photorefractive medium wherein an interference pattern is formed owing to the interaction of the reference beam with the light of the object beam.

In the case of digital data storage media, the object beam typically passes through a spatial light modulator, e.g., a liquid crystal shutter matrix, rather than being reflected off of an object in order to form the holographic image.

Regardless of the application (e.g., the storage of images as data), subsequently directing a reference beam onto the holographic storage medium results in a reconstruction of an image representative of the originally illuminated object or stored digital data.

Also known are techniques for storing a plurality of such images within a single photorefractive medium via angle-multiplexing of the reference beams. Such angle-multiplexing is discussed in "THEORY OF OPTICAL INFORMATION STORAGE IN SOLIDS," *Applied Optics*, Vol. 2, No. 4, p. 393 (1963). The method of angle-multiplexing generally involves maintaining a constant angle for the object beam, while varying the angle of the reference beam for each exposure. Angle-multiplexing thus allows a large number of holograms to be stored within a common volume of photorefractive medium, thereby greatly enhancing the storage density thereof.

However, one problem commonly associated with the use of angle-multiplexed holograms in photorefractive media is the reduction of diffraction efficiency, i.e., the amount of the reference beam diffracted into a re-constructed object beam during a read process, as holograms are read therefrom. Each time one particular hologram is read from the photorefractive material, the diffraction efficiencies of all of the other holograms are degraded. Thus, over time, the ability to accurately reproduce the images stored within the photorefractive media is reduced.

Although fixing techniques have been developed for mitigating the problem of diffraction pattern degradation due to the repeated reading of holograms stored within the photorefractive material, such fixing techniques suffer various limitations. Some of these techniques are not suitable for applications requiring that holograms stored within the photorefractive medium be read within a short time of their being stored therein.

For example, as taught in "MULTIPLE STORAGE AND ERASURE OF FIXED HOLOGRAMS IN FE-DOPED $LiNbO_3$," *Applied Physics Letters*, Vol. 26, No. 4, p. 182 (1975), holograms may be fixed within iron-doped lithium niobate ($Fe:LiNbO_3$) by heating the latter to approximately 160° C. for approximately 15 minutes. However, the time delay of 15 minutes introduced by the fixing process makes this technique unsuitable for many applications.

Additionally, as taught in "STORAGE OF 500 HIGH-RESOLUTION HOLOGRAMS IN A $LiNbO_3$ CRYSTAL", *Optics Letters*, Vol. 16, No. 8, p. 605 (1991), the use of an exposure schedule has been found to be helpful in minimizing diffraction efficiency degradation. According to such exposure schedules, earlier stored holograms are formed utilizing more intense object and reference beams than later stored holograms, such that, each subsequent write process tends to lower the diffraction efficiency of the earlier stored holograms in a manner which substantially equalizes the diffraction efficiency of all stored holograms. Thus, according to such exposure schedules, each succeeding hologram is stored at a lower intensity than the preceding hologram.

Although the use of such exposure schedules tends to equalize diffraction efficiencies among different holograms, it does not prevent subsequent degradation of the diffraction efficiencies of the holograms during later read-out processes.

As such, although the prior art has recognized to a limited extent the problem of diffraction efficiency degradation of holograms in photorefractive media, the proposed solutions have, to date, been ineffective in providing a satisfactory remedy.

As such, it is desirable to provide a system and implementing method whereby unfixed holograms formed within photorefractive storage media may be maintained within the storage media in such a manner that the degradation effects of repetitive reading are significantly mitigated.

SUMMARY OF THE INVENTION

The present invention specifically addresses and alleviates the above-mentioned deficiencies associated with the prior art. More particularly, the present invention comprises a system and method for dynamically refreshing angle-multiplexed holograms in photorefractive medium via self-enhancement. Self-enhancement is described in "SELFENHANCEMENT IN LITHIUM NIOBATE," *Optics Communications*, Volume 72, No. 3, 4, Jul. 15, 1989.

The method of the present invention comprises simultaneously exposing the photorefractive medium to a plurality of reference beams, each reference beam being oriented at an angle corresponding to an angle at which a hologram was previously stored within the photorefractive media. The frequency and exposure time of the respective reference beams are regulated such that each reference beam enhances the associated stored diffraction pattern without introducing undesirable interference patterns or causing image degradation as a result of the pair-wise interaction of the reference beams. Thus, according to the present invention, unfixed holograms are formed within a photorefractive medium such as $Fe:LiNbO_3$ or other optically refreshable material. Thereafter, the medium is dynamically refreshed, thus permitting the unfixed angle-multiplexed holograms to be read a large number of times before they must be rewritten.

In the present invention, each reference beam has a unique frequency that differs from the frequencies of the other reference beams by a regulated amount sufficient to avoid the generation of plane-wave holograms due to reference beam interference as discussed in further detail below. The exposure time is regulated such that the desired hologram efficiency enhancement is effected. The difference in frequency of adjacent reference beams is at least one-half the inverse of the exposure time of the holograms.

During the process of dynamically refreshing angle-multiplexed holograms, traveling waves are formed by the interaction of the reference beams. Distinct reference beam frequencies cause the traveling waves to move so as to avoid the formation of plane-wave holograms which would otherwise result. It is important that each plane-wave so formed move by at least one-half wavelength during each refresh process, so as to prevent the formation of a diffraction pattern which would define a plane-wave hologram. By moving one-half of a cycle, each traveling wave moves such that it becomes 180° out of phase with itself during the refresh process, thereby preventing sufficient exposure at any given position so as to result in the formation of such a diffraction pattern.

The plurality of reference beams are preferably generated by an acousto-optic modulator, preferably a Bragg cell. In the preferred embodiment of the present invention, a radio frequency periodic linear chirp signal drives the Bragg cell so as to produce the desired referenced beams.

Thus, a reference beam is directed at a unique angle to the photorefractive medium and is separated in frequency from adjacent reference beams. In this way, a unique reference beam is provided for each stored hologram so as to facilitate self-enhancement of all holograms without the formation of undesirable plane-wave holograms caused by interference of the reference beams among themselves.

Such dynamic refreshing of the angle-multiplexed holograms may thus be periodically performed, typically after performing a sequence of read cycles, so as to facilitate the performance of a greater number of read cycles prior to the need to rewrite the holograms within the photorefractive medium. As such, rather than being limited by the degradation of the diffraction efficiency of the stored holograms, the number of read/refresh cycles is limited by an increase in the noise floor which occurs during each refresh process. Rewriting of the holograms thus is only necessary when the noise floor reaches sufficient amplitude so as to interfere with the read-out process.

These, as well as other advantages of the present invention will be more apparent from the following description and drawings. It is understood that changes in the specific structure shown and described may be made within the scope of the claims without departing from the spirit of the invention.

BRIEF DESCRIPTION OF THE DRAWINGS

FIG. 1 schematically illustrates the storage of a hologram within photorefractive storage medium according to contemporary methodology;

FIG. 2 schematically illustrates the read-out of a hologram from photorefractive storage medium according to contemporary methodology;

FIG. 3 is a graph showing read-out diffraction efficiency of an angle-multiplexed volume hologram being read out in a manner which is self-enhancing;

FIG. 4 shows the diffraction efficiency of holograms not being read out, each of which decays as one hologram is being read out;

FIG. 7 shows the sequential storage of N angle-multiplexed volume holograms;

FIG. 8 shows the read-out of the $n^{th}$ hologram, which simultaneously results in its own self-enhancement and the partial erasure or degradation of all other holograms;

FIG. 9 shows the self-enhancement of all of the stored holograms by simultaneously exposing the photorefractive storage medium to all $R_N$ reference beams, each one of which is frequency-shifted relative to the other;

DETAILED DESCRIPTION OF THE PREFERRED EMBODIMENT

Figure 5:
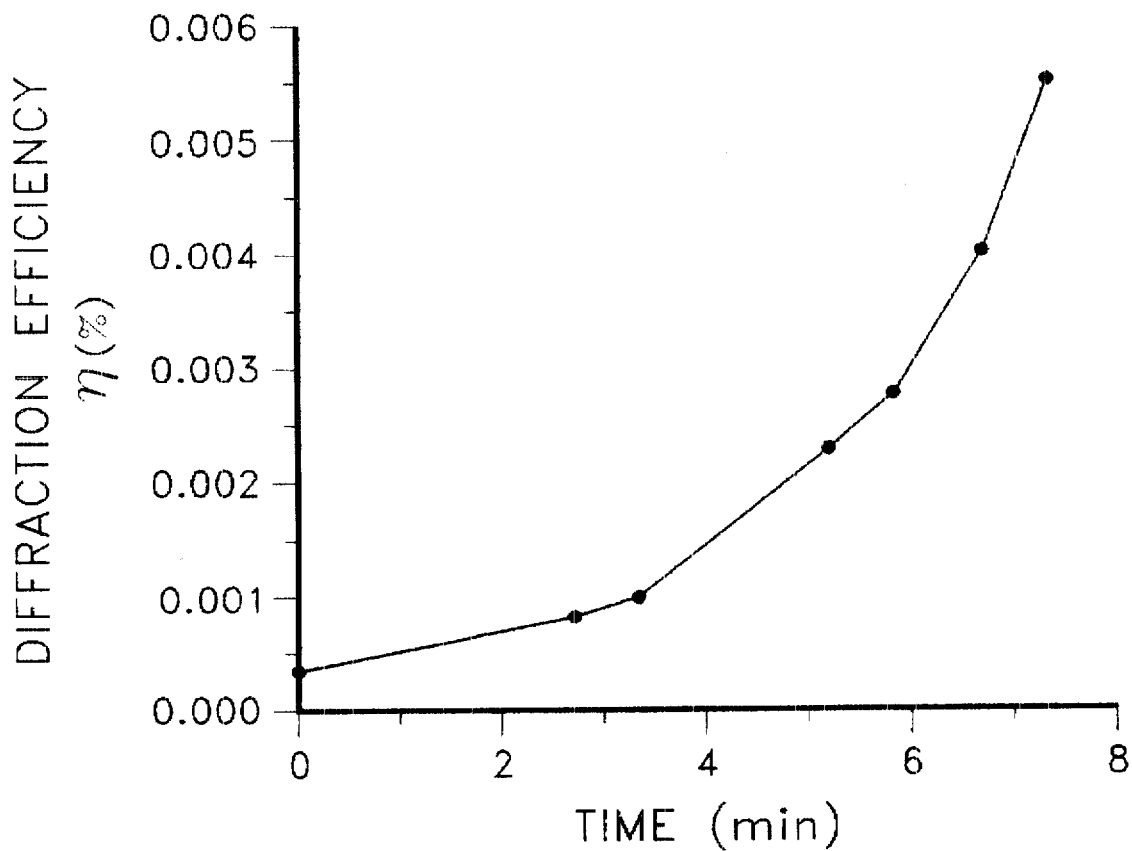
FIG. 5 is a graph showing self-enhancement of diffraction efficiency in the case of a hologram whose diffraction efficiency is initially very low.

The detailed description set forth below in connection with the appended drawings is intended as a description of the presently preferred embodiment of the invention, and is not intended to represent the only form in which the present invention may be constructed or utilized. The description sets forth the functions and sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

The method for dynamically refreshing angle-multiplexed holograms in photorefractive media of the present invention is illustrated in FIGS. 1 through 12 which depict a presently preferred embodiment of the invention. Referring now to FIGS. 1 and 2, the processes for the storing and reading, respectively, of holograms in photorefractive storage medium 10 according to contemporary methodology are shown.

With particular reference to FIG. 1, a single volume hologram is formed in the photorefractive storage medium 10 by the interference of object beam $O_n$ and reference beam $R_n$. The object beam $O_n$ comprises either the light reflected from the object being imaged or light which has been modulated so as to be representative of digital data. The object beam $O_n$ is directed onto the photorefractive storage medium 10 at a first angle $\phi$ and the reference beam $R_n$ is directed onto the photorefractive storage medium at a second angle $\psi_n$.

With particular reference to FIG. 2, the hologram is read-out of the photorefractive storage medium 10 by directing the reference beam $R_n$ into the photorefractive storage medium 10 at the same angle $\psi_n$ at which the reference beam $R_n$ was originally directed during the process of forming the hologram, as discussed above. Object beam $O_n$ emerges from medium 10 as a reconstruction of the original object beam $O_n$ used to record the hologram.

According to the methodology of the present invention, a dynamic refresh process is utilized to cause the amount of the reference beam $R_n$ that is diffracted so as to form the reconstructed object beam $O_n$, to increase with time. Thus, diffraction efficiency is increased such that it no longer limits the number of read operations that may be performed before a re-write is necessary.

Referring now to FIGS. 3 and 4, the enhancement of the diffraction efficiency of the hologram being read out and the consequent and simultaneous degradation of the diffraction efficiency of all other holograms is illustrated.

With particular reference to FIG. 3, reading out of a selected hologram at one particular angle within an angle multiplexed volume hologram results in increased diffraction efficiency for that particular hologram, as discussed in "SELFENHANCEMENT IN LITHIUM NIOBATE," *Optics Communications*, Volume 72, No. 3, 4, Jul. 15, 1989.

With particular reference to FIG. 4, it is well known that all other holograms, which initially have approximately the same diffraction efficiency as a hologram being read out, tend to degrade over time with each additional read-out.

Figure 6:
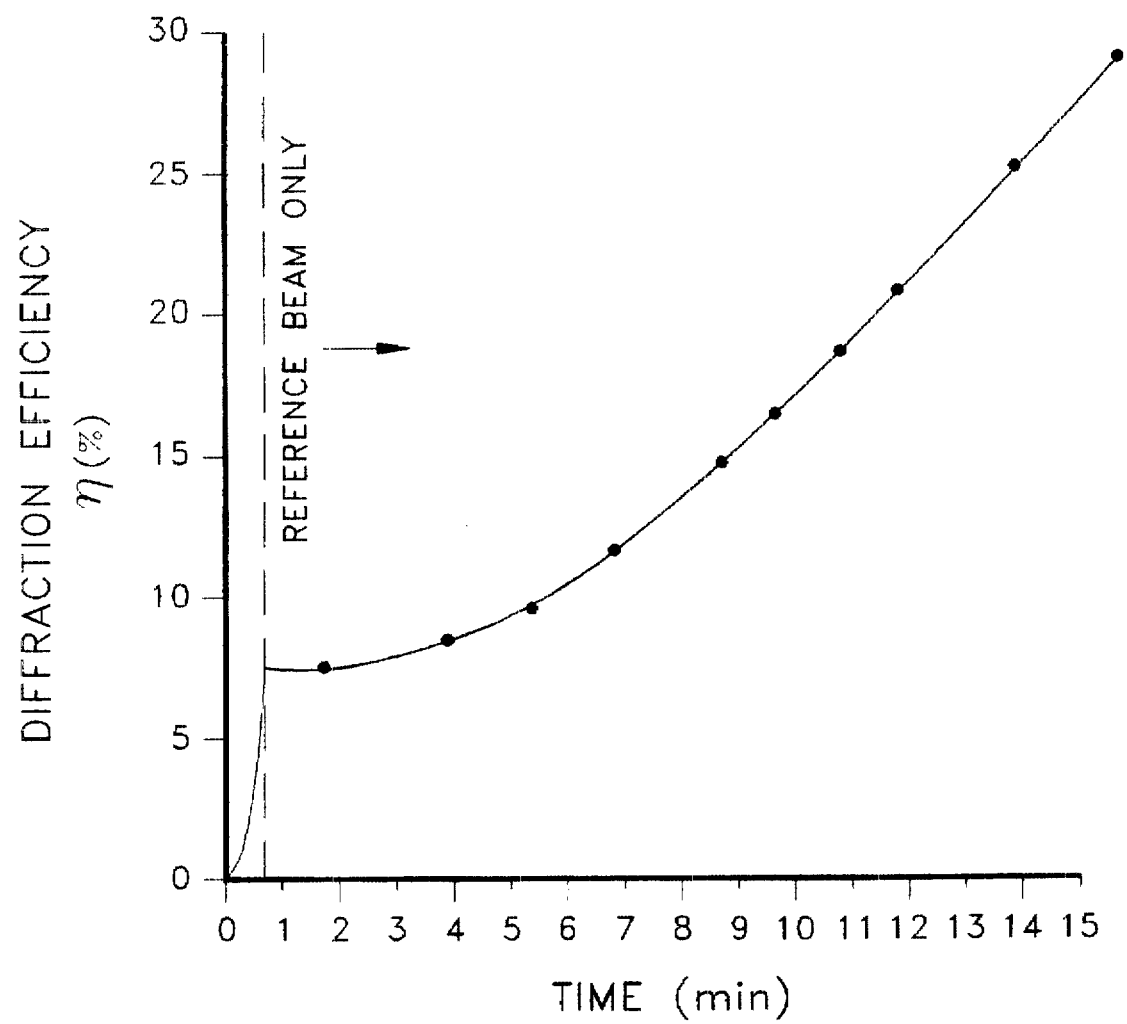
FIG. 6 is a graph showing self-enhancement of diffraction efficiency in the case of a hologram whose diffraction efficiency is initially very high.

Referring now to FIGS. 5 and 6, empirical evidence for the diffraction enhancement effect of the present invention is provided.

It is clear from these graphs that diffraction efficiency ($\eta$) increases over time, as a given hologram is being read out. With particular reference to FIG. 5, the diffraction efficiency of a 0.05 mole % Fe, Z-Cut lithium niobate storage medium is illustrated. It is clear from the graph that in those instances where diffraction efficiency is very low, as the exposure time of the reference beam $R_N$ increases during the read-out process, the diffraction efficiency likewise increases.

Similarly, as shown in FIG. 6, diffraction efficiency likewise increases even when the initial diffraction efficiency is very high.

However, when more than one volume hologram has been stored within a common photorefractive volume, read-out of one of the stored holograms results in partial erasure of all of the other holograms due to interaction with the other holograms. Thus, repeated read-out eventually leads to unacceptable degradation of all of the holograms.

Referring now to FIGS. 7–9, the use of frequency-shifted reference beams to facilitate the simultaneous refreshing of all angle-multiplexed holograms stored within a common volume according to the present invention is illustrated. With particular reference to FIG. 7, the sequential storage of N angle multiplexed volume holograms is shown. In this process, holograms are first sequentially stored within photorefractive storage medium 10 by interfering object beam $O_1$ with plane-wave reference beam $R_1$ (incident on medium 10 at angle $\psi_1$); then interfering object beam $O_2$ with plane-wave reference beam $R_2$ (incident on medium 10 at angle $\psi_2$); and so on, until all object beams $O_N$ have been interfered with all reference beams $R_N$ as to form N independent holograms. During this initial storage process, it is only necessary that $O_n$ and $R_n$ (n=1,2,3, . . . ,N) be temporally coherent (i.e., that $O_n$ and $R_n$ have nominally the same optical frequencies); it is not necessary that the frequencies of the $R_n$ differ from one another.

FIG. 8 illustrates the read-out of one of the holograms stored in FIG. 7. For holograms that have not been, for example, thermally fixed, this process results in a reduction in the diffraction efficiency of all other holograms (m≠n) and a self-enhancement in the diffraction efficiency of hologram "n".

FIG. 9 illustrates the simultaneous self-enhancement of all N holograms. In this process, the optical frequencies of the reference beams are selected so as to differ from one another by a sufficient amount so as to prevent the formation of undesirable plane-wave holograms created by interference between pairs of reference beams. Such undesirable plane-wave holograms are prevented from forming by selecting the self-enhancement refresh time to be at least one-half the reciprocal of the smallest frequency difference between any two reference beams. By selecting the reference beam frequencies in this matter, the traveling wave patterns generated by pairs of reference beams interfering with each other travel by at least one-half the period of an interference pattern, thereby preventing cumulative generation of the latter.

As described above, each of the different reference beams $R_1$ to $R_N$ is frequency shifted relative to the others so as to prevent the occurrence of undesirable plane-wave holograms. The frequency difference between reference beams required to avoid the creating of such plane-wave holograms is a function of exposure time. Reference beams of two different frequencies, $v_i$ and $v_j$, interfere to create a traveling (running) interference pattern with intensity given by:

$$I(t,x) = 2 + 2\cos[(k_i\sin\psi_i - k_j\sin\psi_j)x - 2\pi(v_i - v_j)t] \quad (1)$$

where $k_i \approx k_j \approx k_o = 2\pi/\lambda_o$ and $\lambda_o$ is the optical wavelength. The velocity of the running interference pattern is given by:

$$v = \frac{\lambda_o(v_i - v_j)}{\sin\psi_i - \sin\psi_j} \quad (2)$$

In order to avoid the creation of an interference hologram, $I(t,x)$ must move by at least one-half a period during the exposure time. The period of $I(t,x)$ is given by:

$$\Lambda = \frac{\lambda_o}{\sin\psi_i - \sin\psi_i} \quad (3)$$

Therefore, the frequency difference between any two reference beams must be at least:

$$v_i - v_j \geq \frac{1}{2} \Delta t \quad (4)$$

where $\Delta t$ is the exposure time.

A set of reference beams ($R_1, R_2, \ldots, R_N$) with the requisite frequency separation may be generated using an acousto-optic Bragg cell.

Figure 10:
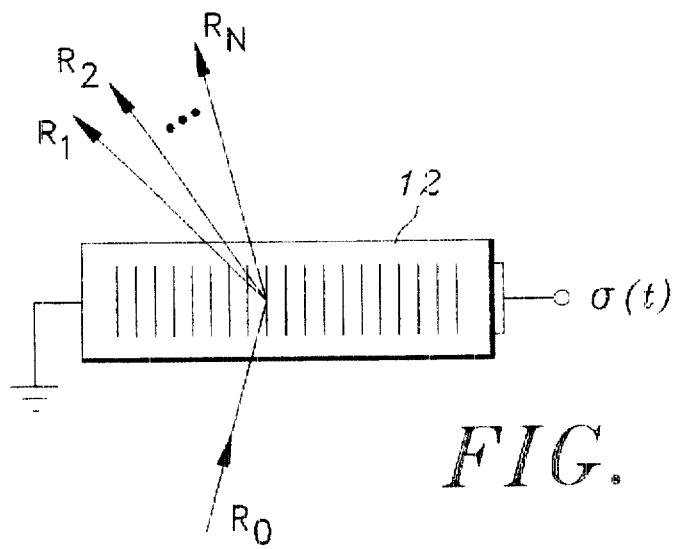
FIG. 10 is a schematic representation of an acousto-optic modulator or Bragg cell for simultaneously generating equal-amplitude referenced beams, each one of which is frequency-shifted relative to the others.

With particular reference to FIG. 10, an acousto-optic modulator, preferably a Bragg cell, receives a radio frequency drive signal $\sigma(t)$. The drive signal $\sigma(t)$ causes the Bragg cell to generate reference beams having the desired frequency separations and also having substantially the same amplitudes.

Figure 11:
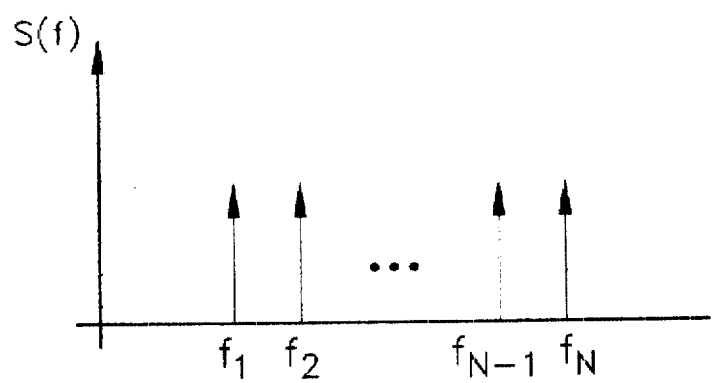
FIG. 11 is the frequency spectrum of the radio frequency signal used to drive the Bragg cell of FIG. 10.

Referring now to FIG. 11, the frequency spectrum of the radio frequency drive signal for the Bragg cell of FIG. 10 is illustrated. Preferably, the frequency spectrum corresponds to a periodic linear chirp, in which the chirp spans the entire spectrum of S(f) and the period is the inverse of the difference in frequencies, i.e., $\sigma_i - v_j$ (j=i+1).

For example, for a typical Bragg cell with a band width of 100 MHz, the simultaneous read-out refreshment of 1,000 holograms implies a frequency separation of $10^5$ Hz for an exposure time which must be at least $5 \times 10^{-6}$ seconds long.

Figure 12:
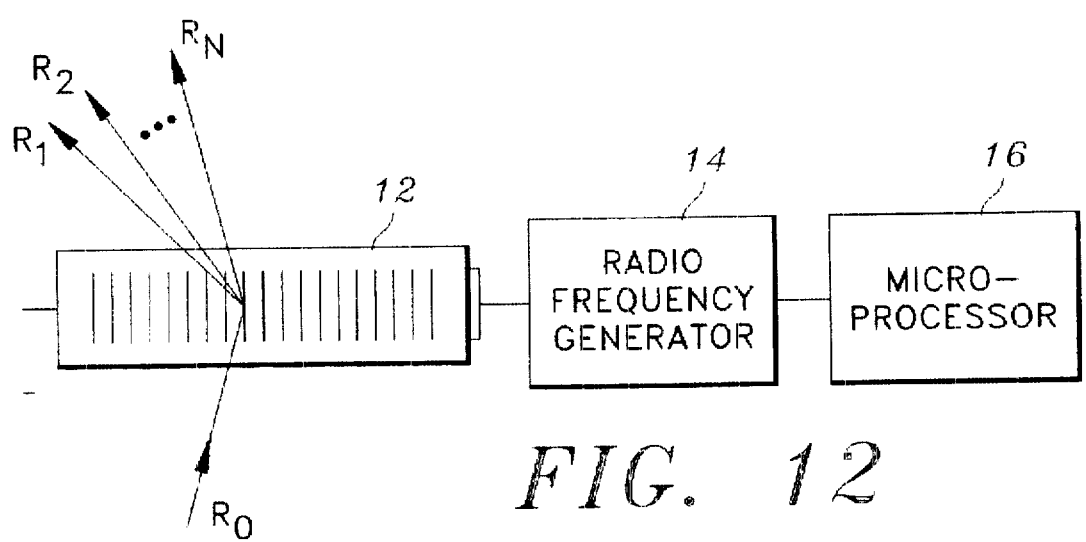
FIG. 12 is a schematic representation of a microprossesor controlled radio frequency generator being used to provide an input signal to the Bragg cell of FIG. 10.

Referring now to FIG. 12, a microprocessor 16 may optionally be utilized to control a radio frequency generator 14, so as to provide an input signal to the Bragg cell 12.

It is understood that the exemplary method for dynamically refreshing angle-multiplexed holograms and photorefractive media described herein and shown in the drawings represents only a presently preferred embodiment of the invention. Indeed, various modifications and additions may be made to such embodiment without departing from the spirit and scope of the invention. For example, the method of the present invention may be applied to various photorefractive media other than iron-doped lithium niobate, that are similarly capable of effecting enhancement of stored optical holograms.

Thus, these and other modifications and additions may be obvious to those skilled in the art and may be implemented to adapt the present invention for use in a variety of different applications.

What is claimed is:

1. A method for dynamically refreshing angle-multiplexed holograms stored in a photorefractive medium, said method comprising the steps of:
   a) simultaneously exposing the photorefractive medium to a plurality of reference beams, each reference beam being oriented at an angle corresponding to an angle at which a hologram was previously stored within the photorefractive medium;
   b) regulating the frequencies of the reference beams and the exposure time of the medium to the reference beams so as to enhance holograms stored within the medium without introducing additional interference patterns resulting from interaction between the reference beams;
   c) wherein the frequency of each of the reference beams differs from the frequency of any other reference beam by at least one-half the reciprocal of the exposure time of the holograms.

2. The method as recited in claim 1 wherein each reference beam has a unique frequency.

3. The method as recited in claim 1 wherein the frequency of each of the reference beams differs from the frequency of any other reference beam by an amount sufficient to avoid the generation of plane-wave holograms due to reference beam interference.

4. The method as recited in claim 1 wherein the plurality of reference beams are generated by an acousto-optic modulator.

5. The method as recited in claim 1 wherein the plurality of reference beams are generated by a Bragg cell.

6. The method as recited in claim 1 wherein the plurality of reference beams are generated by a Bragg cell driven by a radio frequency periodic linear chirp signal.

7. The method as recited in claim 1 wherein the number of reference beams is equal to the number of stored holograms.

8. The method as recited in claim 1 wherein the photorefractive medium comprises iron doped lithium niobate.

9. A system for dynamically refreshing angle-multiplexed holograms, said system comprising:
   a) a photorefractive medium within which a plurality of angle-multiplexed holograms are stored;
   b) an acousto-optic modulator for simultaneously generating a plurality of reference beams, each reference beam having a unique frequency and being oriented at an angle corresponding to an angle at which one of the holograms was previously stored;
   c) control circuitry for regulating the frequency and duration of reference beams to which the medium is exposed so as to enhance holograms stored within the medium without introducing additional interference patterns resulting from interaction between the reference beams;
   d) wherein the frequencies of each of the reference beams differ from the frequency of any other reference beam by an amount at least equal to one-half the inverse of the exposure time of the holograms.

10. A system for dynamically refreshing angle-multiplexed holograms, said system comprising:
   a) a photorefractive medium within which a plurality of angle-multiplexed holograms are stored;
   b) an acousto-optic modulator for simultaneously generating a plurality of reference beams, each reference beam having a unique frequency and being oriented at an angle corresponding to an angle at which one of the holograms was previously stored; and
   c) control circuitry for regulating the frequency and duration of reference beams to which the medium is exposed so as to enhance holograms stored within the medium without introducing additional interference patterns resulting from interaction between the reference beams;
   d) wherein the control circuit is operative to regulate the exposure time such that a resulting travelling wave interference pattern within the media traverses at least one-half wavelength.

11. The system as recited in claim 10 wherein the acousto-optical modulator is a Bragg cell.

12. The system as recited in claim 10 wherein the photorefractive medium is a high-end doped lithium niobate.

* * * * *